(12) United States Patent
Im et al.

(10) Patent No.: US 7,645,337 B2
(45) Date of Patent: Jan. 12, 2010

(54) SYSTEMS AND METHODS FOR CREATING CRYSTALLOGRAPHIC-ORIENTATION CONTROLLED POLY-SILICON FILMS

(75) Inventors: James S. Im, New York, NY (US); Paul Christian van der Wilt, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 80 days.

(21) Appl. No.: 10/994,205

(22) Filed: Nov. 18, 2004

(65) Prior Publication Data
US 2006/0102901 A1    May 18, 2006

(51) Int. Cl.
*C30B 13/00* (2006.01)
*H01L 21/20* (2006.01)

(52) U.S. Cl. ............... 117/43; 117/37; 117/44; 117/45; 117/46; 117/904; 438/482; 438/486; 438/487

(58) Field of Classification Search ............ 117/1, 117/37, 43–46, 904; 257/1; 438/1, 482, 438/486, 487
See application file for complete search history.

(56) References Cited

U.S. PATENT DOCUMENTS

| | | | |
|---|---|---|---|
| 3,632,205 A | 1/1972 | Marcy | |
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A | 12/1988 | Liu | |
| 4,800,179 A | 1/1989 | Mukai | |
| 4,855,014 A | 8/1989 | Kakimoto et al. | |
| 4,870,031 A | 9/1989 | Sugahara et al. | |
| 4,940,505 A | 7/1990 | Schachameyer et al. | |

(Continued)

FOREIGN PATENT DOCUMENTS

DE        198 39 718 A1     3/2000

(Continued)

OTHER PUBLICATIONS

Im et al., U.S. Appl. No. 11/141,815.*

(Continued)

*Primary Examiner*—Robert M Kunemund
*Assistant Examiner*—G. Nagesh Rao
(74) *Attorney, Agent, or Firm*—Wilmer Cutler Pickering Hale and Dorr LLP

(57) ABSTRACT

In accordance with one aspect, the present invention provides a method for providing polycrystalline films having a controlled microstructure as well as a crystallographic texture. The methods provide elongated grains or single-crystal islands of a specified crystallographic orientation. In particular, a method of processing a film on a substrate includes generating a textured film having crystal grains oriented predominantly in one preferred crystallographic orientation; and then generating a microstructure using sequential lateral solidification crystallization that provides a location-controlled growth of the grains orientated in the preferred crystallographic orientation.

19 Claims, 18 Drawing Sheets

U.S. PATENT DOCUMENTS

| | | | |
|---|---|---|---|
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,453,594 A | 9/1995 | Konecny |
| 5,456,763 A | 10/1995 | Kaschmitter et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,591,668 A | 1/1997 | Maegawa et al. |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Russell et al. |
| 6,072,631 A | 6/2000 | Guenther et al. |
| 6,081,381 A | 6/2000 | Shalapenok et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,203,952 B1 | 3/2001 | O'Brien et al. |
| 6,235,614 B1 | 5/2001 | Yang |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 * | 11/2001 | Im ................ 117/43 |
| 6,326,186 B1 | 12/2001 | Kirk et al. |
| 6,326,215 B1 * | 12/2001 | Keen .................. 436/518 |
| 6,326,286 B1 * | 12/2001 | Park et al. ............. 438/478 |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,535,535 B1 | 3/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto |
| 6,693,258 B2 | 2/2004 | Sugano et al. |
| 6,734,635 B2 | 5/2004 | Kunii et al. |
| 6,784,455 B2 | 8/2004 | Maekawa et al. |
| 6,830,993 B1 * | 12/2004 | Im et al. ............... 438/479 |
| 6,858,477 B2 | 2/2005 | Deane et al. |
| 6,908,835 B2 | 6/2005 | Sposili et al. |
| 6,961,117 B2 | 11/2005 | Im |
| 7,029,996 B2 * | 4/2006 | Im et al. ............... 438/487 |
| 7,091,411 B2 | 8/2006 | Falk et al. |
| 7,115,503 B2 * | 10/2006 | Im ..................... 438/660 |
| 7,187,016 B2 | 3/2007 | Arima |
| 7,217,605 B2 | 5/2007 | Kawasaki et al. |
| 7,297,982 B2 | 11/2007 | Suzuki et al. |
| 7,311,778 B2 | 12/2007 | Im et al. |
| 7,399,359 B2 | 7/2008 | Im et al. |
| 2001/0001745 A1 | 5/2001 | Im et al. |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2003/0006221 A1 | 1/2003 | Hong et al. |
| 2003/0013278 A1 | 1/2003 | Jang et al. |
| 2003/0029212 A1 | 2/2003 | Im |
| 2003/0068836 A1 | 4/2003 | Hongo et al. |
| 2003/0096489 A1 | 5/2003 | Im et al. |
| 2003/0119286 A1 * | 6/2003 | Im et al. ............... 438/487 |
| 2003/0148565 A1 | 8/2003 | Yamanaka |
| 2003/0194613 A1 | 10/2003 | Voutsas et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |

| | | | |
|---|---|---|---|
| 2005/0034653 | A1 | 2/2005 | Im et al. |
| 2005/0059265 | A1 | 3/2005 | Im |
| 2005/0141580 | A1 | 6/2005 | Partlo et al. |
| 2005/0142450 | A1 | 6/2005 | Jung |
| 2005/0142451 | A1 | 6/2005 | You |
| 2005/0202654 | A1 | 9/2005 | Im |
| 2005/0255640 | A1* | 11/2005 | Im et al. ............... 438/166 |
| 2006/0030164 | A1* | 2/2006 | Im ........................ 438/795 |
| 2006/0040512 | A1* | 2/2006 | Im ........................ 438/795 |
| 2006/0060130 | A1* | 3/2006 | Im ........................... 117/46 |
| 2006/0102901 | A1 | 5/2006 | Im et al. |
| 2006/0125741 | A1 | 6/2006 | Tanaka et al. |
| 2006/0134890 | A1* | 6/2006 | Im ........................ 438/478 |
| 2006/0211183 | A1 | 9/2006 | Duan et al. |
| 2006/0254500 | A1* | 11/2006 | Im et al. ............... 117/43 |
| 2007/0007242 | A1* | 1/2007 | Im ........................ 216/62 |
| 2007/0010074 | A1* | 1/2007 | Im ........................ 438/486 |
| 2007/0010104 | A1* | 1/2007 | Im et al. ............... 438/795 |
| 2007/0012664 | A1* | 1/2007 | Im ........................ 219/121.65 |
| 2007/0020942 | A1* | 1/2007 | Im ........................ 438/719 |
| 2007/0032096 | A1* | 2/2007 | Im ........................ 438/795 |
| 2007/0108472 | A1 | 5/2007 | Jeong et al. |
| 2007/0111349 | A1 | 5/2007 | Im |
| 2007/0215942 | A1 | 9/2007 | Chen et al. |

FOREIGN PATENT DOCUMENTS

| | | |
|---|---|---|
| DE | 101 03 670 A1 | 8/2002 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 04-279064 | 10/1992 |
| JP | 6252048 | 9/1994 |
| JP | 6283422 | 10/1994 |
| JP | 7176757 | 7/1995 |
| JP | 11064883 | 3/1999 |
| JP | 11-281997 | 10/1999 |
| JP | 2001023920 | 1/2001 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2001 |
| WO | WO-01/18855 | 3/2001 |
| WO | WO-01/71786 | 9/2001 |
| WO | WO-01/71791 | 9/2001 |
| WO | WO-02/31869 | 4/2002 |
| WO | WO-02/42847 | 5/2002 |
| WO | WO-02/86954 | 5/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017379 | 2/2004 |
| WO | WO-2004/017380 | 2/2004 |
| WO | WO-2004/017381 | 2/2004 |
| WO | WO-2004/017382 | 2/2004 |
| WO | WO-2004/075263 | 9/2004 |
| WO | WO-2005/029546 | 3/2005 |
| WO | WO-2005/029548 | 3/2005 |
| WO | WO-2005/029550 | 3/2005 |
| WO | WO-2005/029551 | 3/2005 |

OTHER PUBLICATIONS

Im et al., U.S. Appl. No. 11/293,655.*

Crowder, M. A. et al.: "Parametric investigation of SLS-processed poly-silicon thin films for TFT applications," Preparations and Characterization, Elsevier, Sequoia, NL, vol. 427, No. 1-2, Mar. 3, 2003, pp. 101-107, XP004417451.

Biegelsen, D.K., L. E. Fennell and J.C. Zesch, Origin of oriented crystal growth of radiantly melted silicon on SiO/sub 2, Appl. Phys. Lett. 45, 546 (1984).

Boyd, I. W., "Laser Processing of Thin Films and Microstructures, Oxidation, Deposition and Etching of Insulators," (Springer—Verlag Berlin Heidelber, 1987.

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," Journal of Appl. Phys., 82:4086 (1997).

Brotherton, "Polycrystalline Silicon Thin Film Transistors," Semicond. Sci. Tech., 10:721-738 (1995).

Crowder et al., "Low-Temperature Single-Crystal Si TFT's Fabricated on Si Films Processed via Sequential Lateral Solidification," IEEE Electron Device Letter, 19 (8): 306 (1998).

Crowder et al., "Sequential Lateral Solidification of PECVD and Sputter Deposited a-Si Films", Mat. Res. Soc. Symp. Proc. 621:Q.9.7.1-9.7.6. 2000.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Endert et al., "Excimer Laser: A New Tool for Precision Micromachining," Optical and Quantum Electronics, 27:1319 (1995).

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven," J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Riege et al., "The Effects Microstructural Transitions at Width Transitions on interconnect reliability," Journal of Applied Physics, 87(12): 8467-8472.

Hawkins, W.G. et al., "Origin of lamellae in radiatively melted silicon flims," Appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im et al., "Controlled Super-Lateral Growth of Si Films for Microstructural Manipulation and Optimization," Phys. Stat. Sol. (a), 166:603 (1998).

Im et al., "Crystalline Si Films for Integrated Active-Matrix Liquid-Crystals Displays," MRS Bulletin, 21:39 (1996).

Im et al., "On the Super Lateral Growth Phenomenon Observed in Excimer Laser-Induced Crystallization of Thin Si Films," Appl. Phys. Lett., 64 (17): 2303 (1994).

Im et al., "Phase Transformation Mechanisms Involved in Excimer Laser Crystallization of Amorphous Silicon Films," Appl. Phys. Lett., 63 (14): 1969 (1993).

Im et al., "Single-Crystal Si Films for Thin-Film Transistor Devices," Appl. Phys. Lett., 70(25): 3434 (1997).

Ishida et al., "Ultra-shallow boxlike profiles fabricated by pulsed ultraviolet-laser doping process," J. Vac. Sci. Technol. B 12(1): 399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "Two-step laser recrystallization of poly-Si for effective control of grain boundaries," Journal of Non Crystalline Solids, 266-269: 645-649 (2000).

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358, 1995.

Kim et al., "Multiple Pulse Irradiation Effects in Excimer Laser-Induced Crystallization of Amorphous Si Films," Mat. Res. Soc. Sym. Proc., 321:665-670 (1994).

Kim, "Excimer-Laser-Induced Crystallization of Amorphous Silicon Thin Films," Ph. D. Dissertation Abstract, Columbia University, 1996.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.-J., et al., "The effects of dopants on surface-energy-driven secondary grain growth in silicon films," J. Appl. Phys. 67 (2), Jan. 15, 1990.

Kim, H.J. et al., "New Excimer-laser-crystallization method for producing large-grained and grain boundary-location-controlled Si Films for Thin Film Transistors". Applied Phys. Lett., 68: 1513.

Kimura, M. and K. Egami, Influence of as-deposited film structure on (100) texture in laser-recrystallized silicon on fused quartz, Appl. Phys. Lett. 44, 420 (1984).

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, 43(10): 946-948 (1983).

MICRO/LAS Lasersystem GMBH, "Overview of Beam Delivery Systems for Excimer Lasers," (1999).

MICRO/LAS Lasersystem GMBH, "UV Optics Systems for Excimer Laser Based Micromachining and Marking," (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).

Nebel, "Laser Interference Structuring of A-Si:h" Amorphous Silicon Technology—1996, San Francisco, CA Apr. 8-12, Materials Research Society Symposium Proceedings, vol. 420, Pittsburgh, PA (1996).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Sato et al., "Mobility anisotropy of electrons in inversion layers on oxidized silicon surfaces," Physical Review B (State) 4, 1950 (1971).

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films of SiO2," Appl. Phys. Lett., 69(19): 2864 (1996).

Sposili et al., "Single-Crystal Si Films via a Low-Substrate-Temperature Excimer-Laser Crystallization Method," Mat. Res. Soc. Symp. Proc., 452: 953-958 (1997).

Thompson, C.V. and H.I. Smith, Surface-energy-driven secondary grain growth in ultrathin (<100 nm) films of silicon, Appl. Phys. Lett. 44, 603 (1984).

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T. et al.: "Effect of process parameters on the structural characteristics of lateralyy grown, laser-annealed polycrystalline silicon films," Journal of applicaed Physics, vol. 94, No. 12, Dec. 15, 2003.

Watanabe et al., "Crystallization Process of Polycrystalline Silicon by KrF Excimer Laser Annealing," Japanese J. of Applied Physics, Part1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

Kim, H.J. et al., "Multiple Pulse Irradiation Effects in Excimer Laser_Induced Crystallization of Amorphous Si Films," Materials Research Society Symposium Proceedings, vol. 321, pp. 665-670, 1994.

van der Wilt, P.C. et al., "The Commercialization of the SLS Technology," Taiwan FPD, Jun. 11, 2004, pp. 1-12.

Kim, C. et al., "Development of SLS-Based SOG Display," IDMC 2005, pp. 252-255.

Knowles, D.S. et al., "P-59: Thin Beam Crystallization Method: a New Laser Annealing Tool with Lower Cost and Higher Yield for LTPS Panels," SID 00 Digest, pp. 1-3.

Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.

van der Wilt, P.C. et al., "State-of-the-Art Laser Crystallization of Si for Flat Panel Displays," PhAST, May 18, 2004, pp. 1-34.

van der Wilt, P.C., "Textured poly-Si films for hybrid SLS," Jul. 2004, pp. 1-5.

Bergmann, R. et al., Nucleation and Growth of Crystalline Silicon Films on Glass for Solar Cells, Phys. Stat. Sol., 1998, pp. 587-602, vol. 166, Germany.

Brotherton, S.D., et al., Characterisation of poly-Si TFTs in Directionally Solidified SLS Si, Asia Display/IDW'01, p. 387-390.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kohler, J.R. et al., Large-grained polycrystalline silicon on glass by copper vapor laser annealing. Thin Solid Films, 1999, pp. 129-132, vol. 337, Elsevier.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Werner, J.H., et al. From polycrystalline to single crystalline silicon on glass, Thin Solid Films 383, 95-100, 2001.

* cited by examiner

Random

"Uniform"

=20 μm; no3927; Step=0.05 μm; Grid 160x200

General case, the defect-free area is {110}

{111}

{100}

4 shots, 200nm Si, 7xPDE

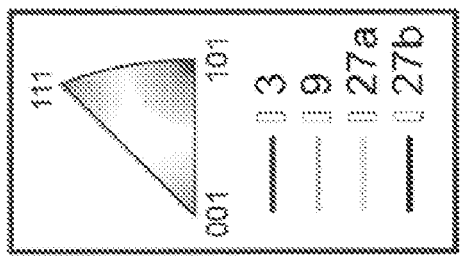
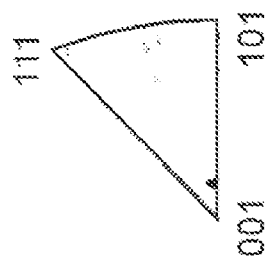
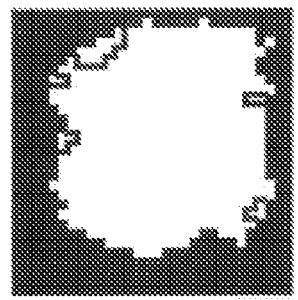
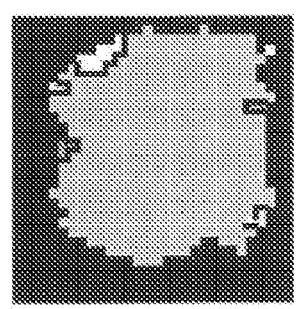
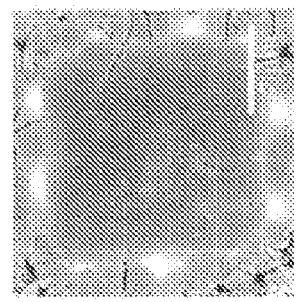
Fig. 13A  Fig. 13B  Fig. 13C
4 shots, 200nm Si, 7xPDE

SYSTEMS AND METHODS FOR CREATING CRYSTALLOGRAPHIC-ORIENTATION CONTROLLED POLY-SILICON FILMS

BACKGROUND

In recent years, various techniques for crystallizing or improving the crystallinity of an amorphous or polycrystalline semiconductor film have been investigated. This technology is used in the manufacture of a variety of devices, such as image sensors and displays, for example, active-matrix liquid-crystal display (AMLCD) devices. In the latter, a regular array of thin-film transistors (TFTs) are fabricated on an appropriate transparent substrate, and each transistor serves as a pixel controller.

Semiconductor films are processed using excimer laser annealing (ELA), also known as line beam ELA, in which a region of the film is irradiated by an excimer laser to partially melt the film and then is crystallized. FIG. 1A illustrate low-temperature poly-silicon (poly-si) (LTPS) microstructures that can be obtained by laser induced melting and solidification. The process typically uses a long, narrow beam shape that is continuously advanced over the substrate surface, so that the beam can potentially irradiate the entire semiconductor thin film in a single scan across the surface. ELA produces small-grained polycrystalline films; however, the method often suffers from microstructural non-uniformities which can be caused by pulse to pulse energy density fluctuations and/or non-uniform beam intensity profiles. FIG. 2 is an image of the random microstructure that results from ELA. The Si film is irradiated multiple times to create the random polycrystalline film with a uniform grain size.

Sequential lateral solidification (SLS) using an excimer laser is one method that has been used to form high quality polycrystalline films having large and uniform grains. SLS is a crystallization process that provides elongated grains of a crystallized material in predefined locations on a film. FIGS. 1B-1D illustrate microstructures that can be obtained by SLS. A large-grained polycrystalline film can exhibit enhanced switching characteristics because the reduced number of grain boundaries in the direction of electron flow provides higher electron mobility. SLS processing controls the location of grain boundaries. U.S. Pat. Nos. 6,322,625; 6,368,945; 6,555,449; and 6,573,531 issued to Dr. James Im, the entire disclosures of which are incorporated herein by reference, and which are assigned to the common assignee of the present application, describe such SLS systems and processes.

FIGS. 3A-3F illustrate the SLS process schematically. In an SLS process, an initially amorphous or polycrystalline film (for example, a continuous wave (CW)—processed Si film, an as-deposited film, or solid phase crystallized film) is irradiated by a very narrow laser beamlet. The beamlet is formed, for example, by passing a laser beam pulse through a slotted mask, which is projected onto the surface of the silicon film. The beamlet melts the amorphous silicon and, upon cooling, the amorphous silicon film recrystallizes to form one or more crystals. The crystals grow primarily inward from edges of the irradiated area toward the center. After an initial beamlet has crystallized a portion of the film, a second beamlet irradiates the film at a location less than the "lateral growth length" from the previous beamlet. In the newly irradiated film location, crystal grains grow laterally from the crystal seeds of the polycrystalline material formed in the previous step. As a result of this lateral growth, the crystals are of high quality along the direction of the advancing beamlet. The elongated crystal grains are generally perpendicular to the length of the narrow beamlet and are separated by grain boundaries that run approximately parallel to the long grain axes.

When polycrystalline material is used to fabricate electronic devices, the total resistance to carrier transport is affected by the combination of barriers that a carrier has to cross as it travels under the influence of a given potential. Due to the additional number of grain boundaries that are crossed when the carrier travels in a direction perpendicular to the long grain axes of the polycrystalline material or when a carrier travels across a larger number of small grains, the carrier will experience higher resistance as compared to the carrier traveling parallel to long grain axes. Therefore, the performance of devices fabricated on polycrystalline films formed using SLS, such as TFTs, will depend upon the crystalline quality and microstructure of the TFT channel relative to the long grain axes, which corresponds to the main growth direction.

To achieve acceptable system performance for devices that utilize a polycrystalline thin film there still remains a need to optimize manufacturing processes that provide a defined, crystallographic orientation of the crystal grains.

SUMMARY OF THE INVENTION

In accordance with one aspect, the present invention provides a method for providing polycrystalline films having a controlled microstructure as well as a crystallographic texture. The methods provide elongated grains or single-crystal islands of a specified crystallographic orientation. In particular, a method of processing a film on a substrate includes providing a textured film having crystal grains oriented predominantly in one preferred crystallographic orientation; and then generating a microstructure using sequential lateral solidification crystallization that provides a location-controlled growth of the grains orientated in the preferred crystallographic orientation. One preferred direction of crystallographic orientation is a direction normal to the surface of the film.

The process of sequential lateral solidification (SLS) generally includes generating a plurality of laser beam pulses; directing the plurality of laser beam pulses through a mask to generate a plurality of patterned laser beams; irradiating a portion of a selected region of a film with one of the plurality of patterned beams, the beam having an intensity that is sufficient to melt throughout its entire thickness the irradiated portion of the film, wherein the irradiated portion of the film laterally crystallizes upon cooling. The process includes repositioning the film to irradiate a subsequent portion of the selected region with patterned beams, such that the subsequent position overlaps with the previously irradiated portion permitting the further lateral growth of the crystal grains. In one embodiment, successive portions of the selected region are irradiated such that the film is substantially completely crystallized in a single traversal of the patterned beams over the selected region of the film. By "completely crystallized" it is meant that the selected region of the film possesses the desired microstructure and crystal orientation, so that no further laser scanning of the region is required. The mask includes a dot-patterned mask and has opaque array patterns which include at least one of dot-shaped areas, hexagonal-shaped areas and rectangular shaped areas.

According to one aspect of the invention, the textured film is generated by one of zone melt recrystallization, solid phase recrystallization, direct deposition methods, surface-energy driven secondary grain growth methods or by pulsed laser crystallization methods. The direct deposition methods comprise one of chemical vapor deposition, sputtering and evaporation. The pulsed laser crystallization methods include SLS or multiple-pulse ELA methods. The film can be a metal film or a semiconductor film.

According to another aspect of the present invention, a system for processing a film on a substrate includes at least one, laser for generating a plurality of laser beam pulses; a film support for positioning the film that is capable of movement in at least one direction; a mask support; optics for directing a first set of laser beam pulses through a first mask to generate a textured film; optics for directing a second set of laser beams onto the textured film; and a controller for controlling the movement of the film support and mask support in conjunction with frequency of laser beam pulses.

According to another aspect of the present invention, a device comprising a polycrystalline thin film having periodically located grains in which each of the grains are predominantly of one crystallographic orientation. The predominant crystallographic orientation is a <111> orientation or in another embodiment is a <100> orientation. The periodically located grains form columns of elongated grains.

The foregoing and other features and advantages of the invention will be apparent from the following more particular description of embodiments of the invention, as illustrated in the accompanying drawings.

BRIEF DESCRIPTION OF THE DRAWINGS

FIGS. 13A-13C illustrate the scanning electron microscopy images (SEM) and the electron back scatter diffraction (EBSD) data of the mostly <100> oriented islands corresponding to the image illustrated in FIG. 10C.

DETAILED DESCRIPTION

The processes and systems described herein, defined as hybrid sequential lateral solidification (SLS), provide elongated grains or single-crystal islands of a specified crystallographic orientation. The embodiments of the invention are predicated on the recognition that the crystal orientation of lateral crystal growth during SLS depends on the orientation of the material at the boundary of the irradiated region. Lateral crystal growth of a material from a solidus boundary defined by a textured crystal promotes growth of that crystallographic orientation.

Figure 1A:
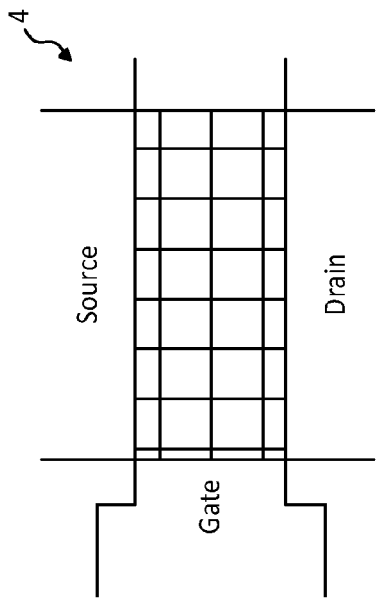
FIG. 1A illustrates low temperature poly-silicon (LTPS) microstructures that are obtained for laser-induced melting and solidification.
Figure 1B:
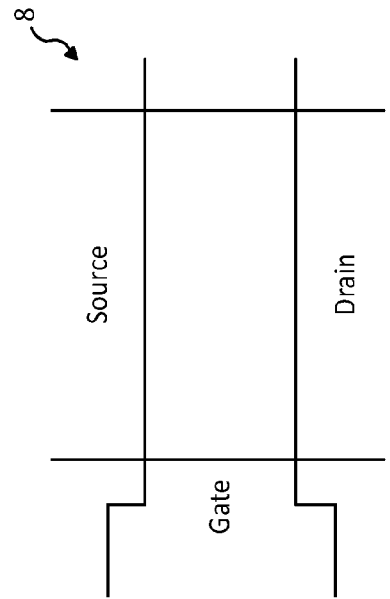
FIGS. 1B-1D illustrate microstructures that are obtained by sequential lateral solidification (SLS).
Figure 1C:
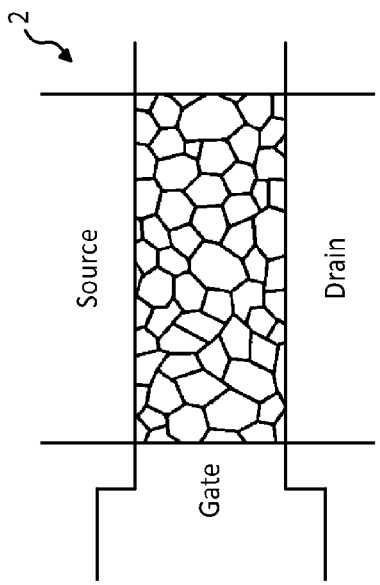
Figure 1D:
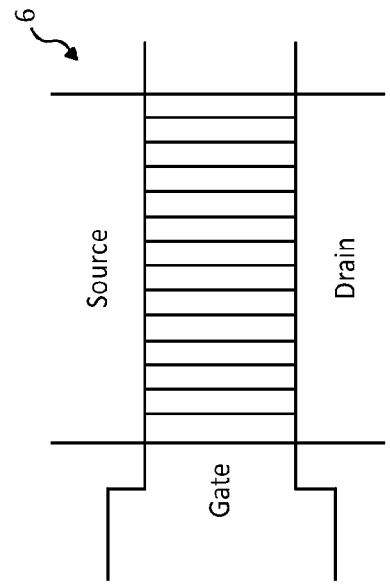
Figure 2:
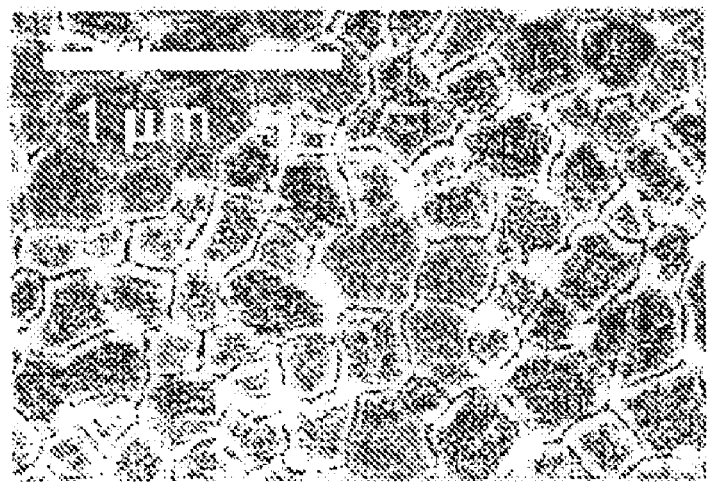
FIG. 2 is an image of the random orientation of the microstructure that results from excimer laser annealing (ELA).
Figure 3A:
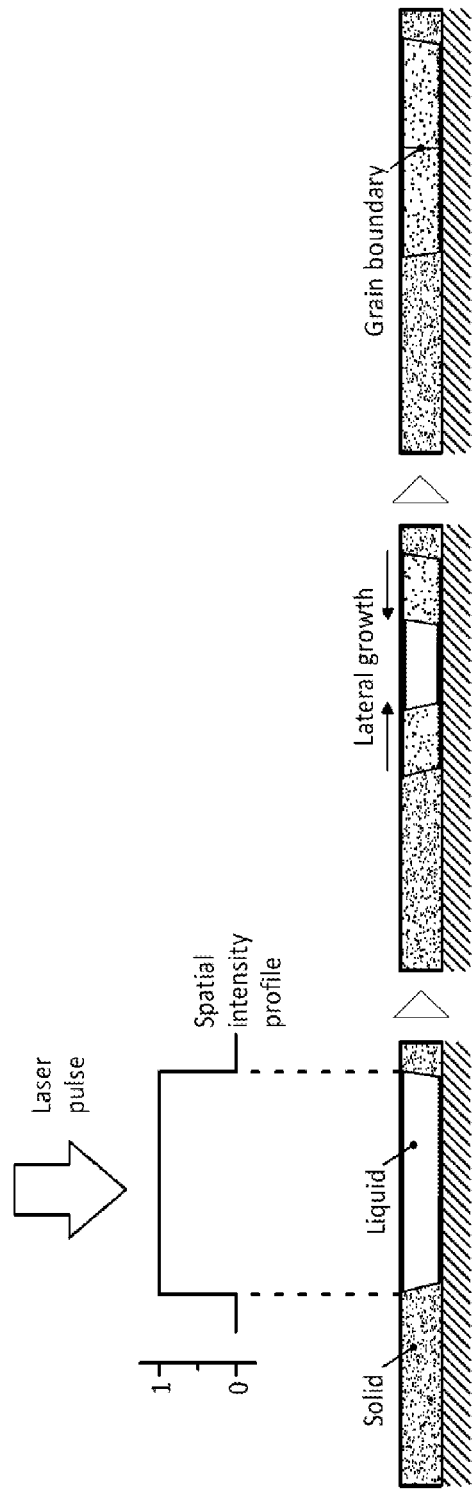
FIGS. 3A-3F illustrate schematically the processes involved in sequential lateral solidification (SLS).
Figure 3B:
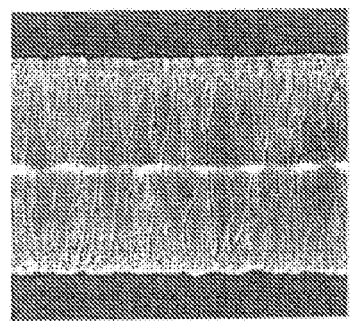
Figure 3C:
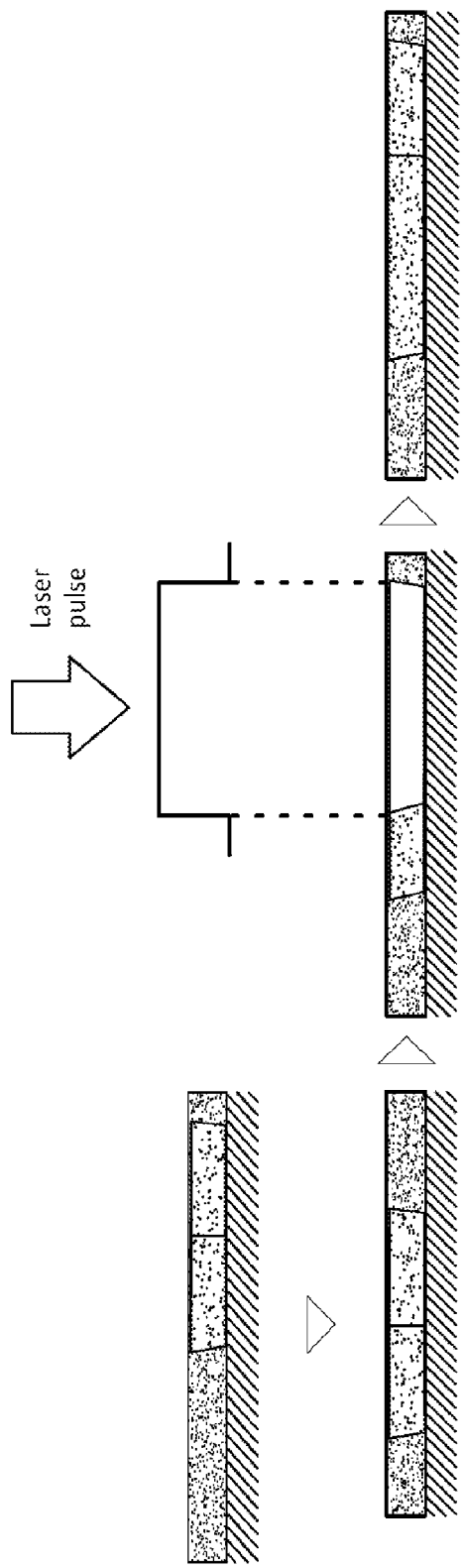
Figure 3D:
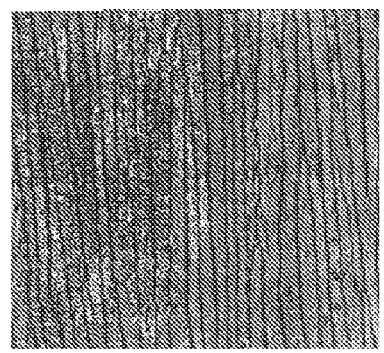
Figure 3E:
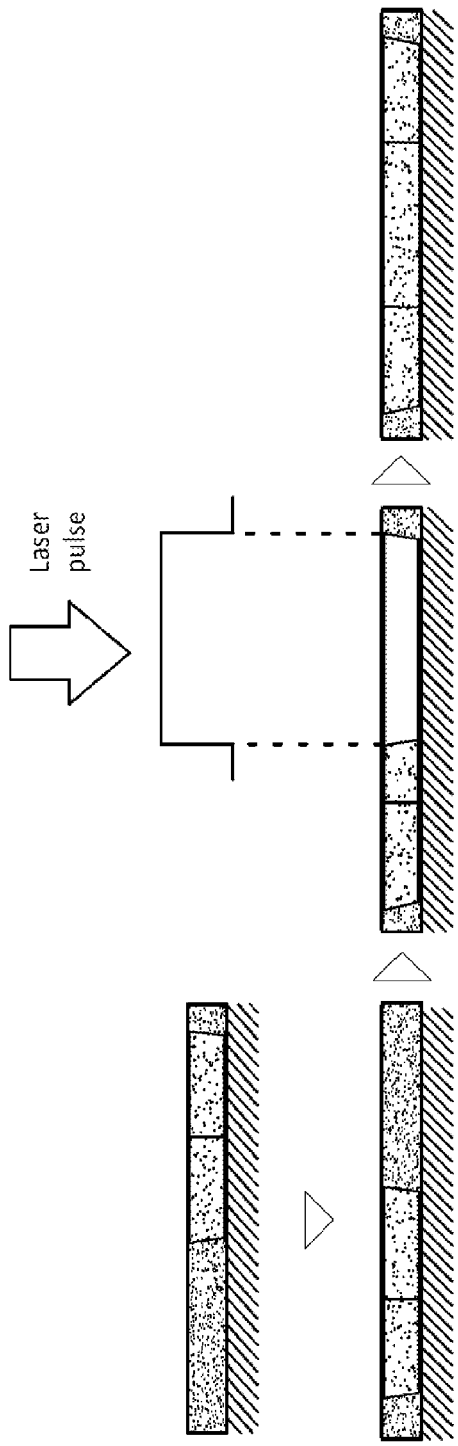
Figure 3F:
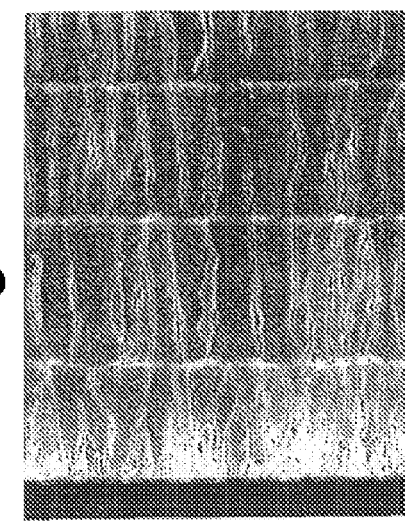
Figure 4:
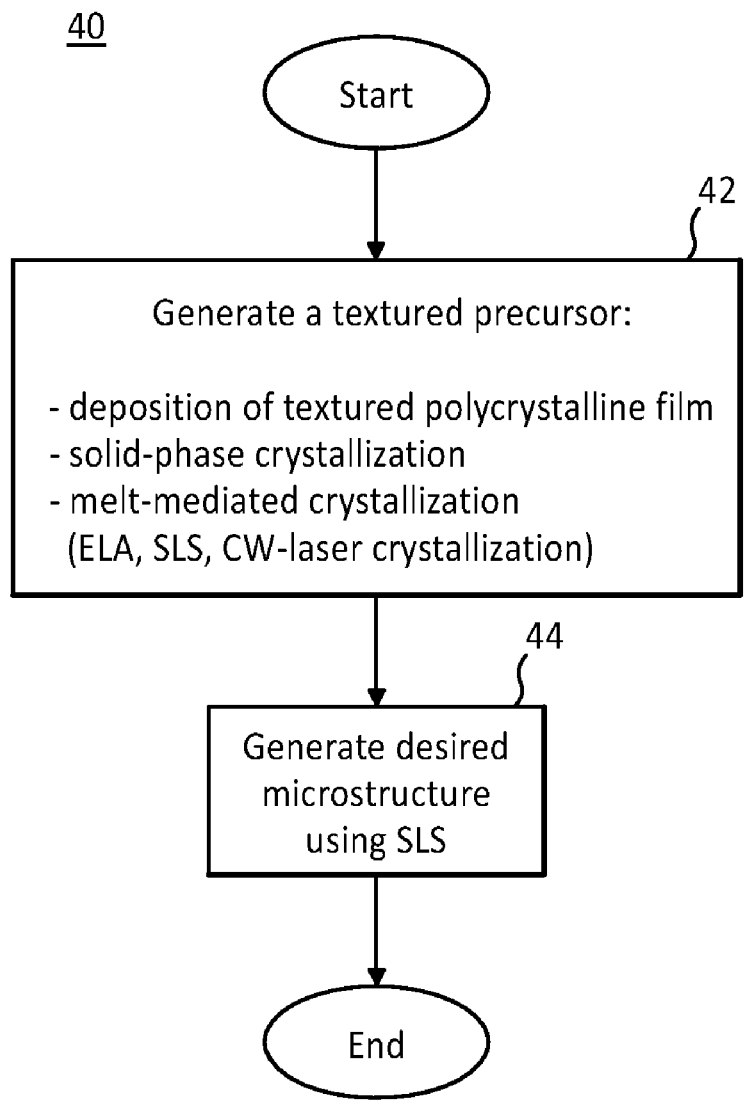
FIG. 4 is a flow diagram of the hybrid sequential lateral solidification (SLS) methods in accordance with an embodiment of the present invention.

At its most basic, hybrid SLS is a two-step process as illustrated in FIG. 4. In the first step 42, a textured precursor is produced or provided. A textured film contains grains having predominantly the same crystallographic orientation in at least a single direction; however, they are randomly located on the surface and are of no particular size (microstructure). More specifically, if one crystallographic axis of most crystallites in a thin polycrystalline film points preferentially in a given direction, we refer to the microstructure as having a one-axial texture. For the embodiments described herein, the preferential direction of the one-axial texture is a direction normal to the surface of the crystallites. Thus, "texture" refers to a one-axial surface texture of the grains as used herein. The degree of texture can vary depending upon the particular application. For example, a higher degree of texture is preferable for a thin film transistor (TFT) being used for a driver circuit as opposed to a TFT that is used for a switch circuit.

In the second step 44 of the hybrid SLS process, SLS is performed. The lateral crystallization results in "location-controlled growth" of grain boundaries and elongated crystals of a desired crystallographic orientation. Location-controlled growth referred to herein is defined as the controlled location of grains and grain boundaries using particular beam patterns and masks such as, for example, dot-patterned masks.

As described briefly herein before, sequential lateral solidification ("SLS") is a crystallization process that provides elongated grains or single-crystal islands of a crystallized material in predefined locations on a film. However, SLS is not able to fully define the crystallographic orientation of those grains. In an SLS process growth begins with existing grains as it is epitaxial growth and, thus, the process cannot provide for growth in a preferred orientation. Epitaxial growth is referred to as the growth of the crystals of one material on the crystal face of another material, such that the crystalline grains of both materials have the same structural orientation. Sequential lateral solidification produces large grained structures through small-scale translation of a thin film between sequential pulses emitted by a pulsed laser. As the film absorbs the energy of each pulse, a small area of the film melts completely and recrystallizes laterally from the solidus/melt interface to form a crystalline region. By "lateral crystal growth" or "lateral crystallization," as those terms are used herein, it is meant a growth technique in which a region of a film is melted to the film/surface interface and in which recrystallization occurs in a crystallization front moving laterally across the substrate surface.

The thin film may be a metal or semiconductor film. Exemplary metals include aluminum, copper, nickel, titanium, gold, and molybdenum. Exemplary semiconductor films include conventional semiconductor materials, such as silicon, germanium, and silicon-germanium. Additional layers situated beneath or above the metal or semiconductor film are contemplated. The additional layers can be made of silicon oxide, silicon nitride and/or mixtures of oxide, nitride or other materials that are suitable, for example, for use as a thermal insulator to protect the substrate from overheating or as a diffusion barrier to prevent diffusion of impurities from the substrate to the film. PCT Publication No. WO 2003/084688 describes methods and systems for providing an aluminum thin film with a controlled crystal orientation using pulsed laser induced melting and nucleation-initiated crystallization, the entire teachings of which are incorporated herein by reference.

A thin film is processed into a location-controlled elongated grain polycrystalline thin film using SLS. An exemplary SLS process includes generating a plurality of excimer laser pulses of a predetermined fluence, controllably modulating the fluence of the excimer laser pulses, homogenizing the intensity profile of the laser pulse plane, masking each homogenized laser pulse to define patterned laser beams, irradiating the thin film with the laser beams to effect melting of portions thereof, and controllably and continuously translating the sample to move the patterned beam across the substrate surface. The laser pulse frequency and the movement (speed and direction) of the sample may be adjusted so that the areas of sequential irradiation of the sample overlap from one irradiation/crystallization cycle to the next, so as to provide for the lateral crystal growth that gives rise to large grains. Pulse frequency and stage and mask position may be coordinated and controlled by a computer. Systems and methods for providing continuous motion sequential lateral solidification are provided in U.S. Pat. No. 6,368,945, which is incorporated herein in its entirety by reference. The exemplary SLS processes are described in U.S. Pat. No. 6,555,449, and U.S. patent application Ser. No. 10/944,350 which uses a dot-patterned mask, the entire teachings of which are incorporated herein by reference.

Figure 5A:
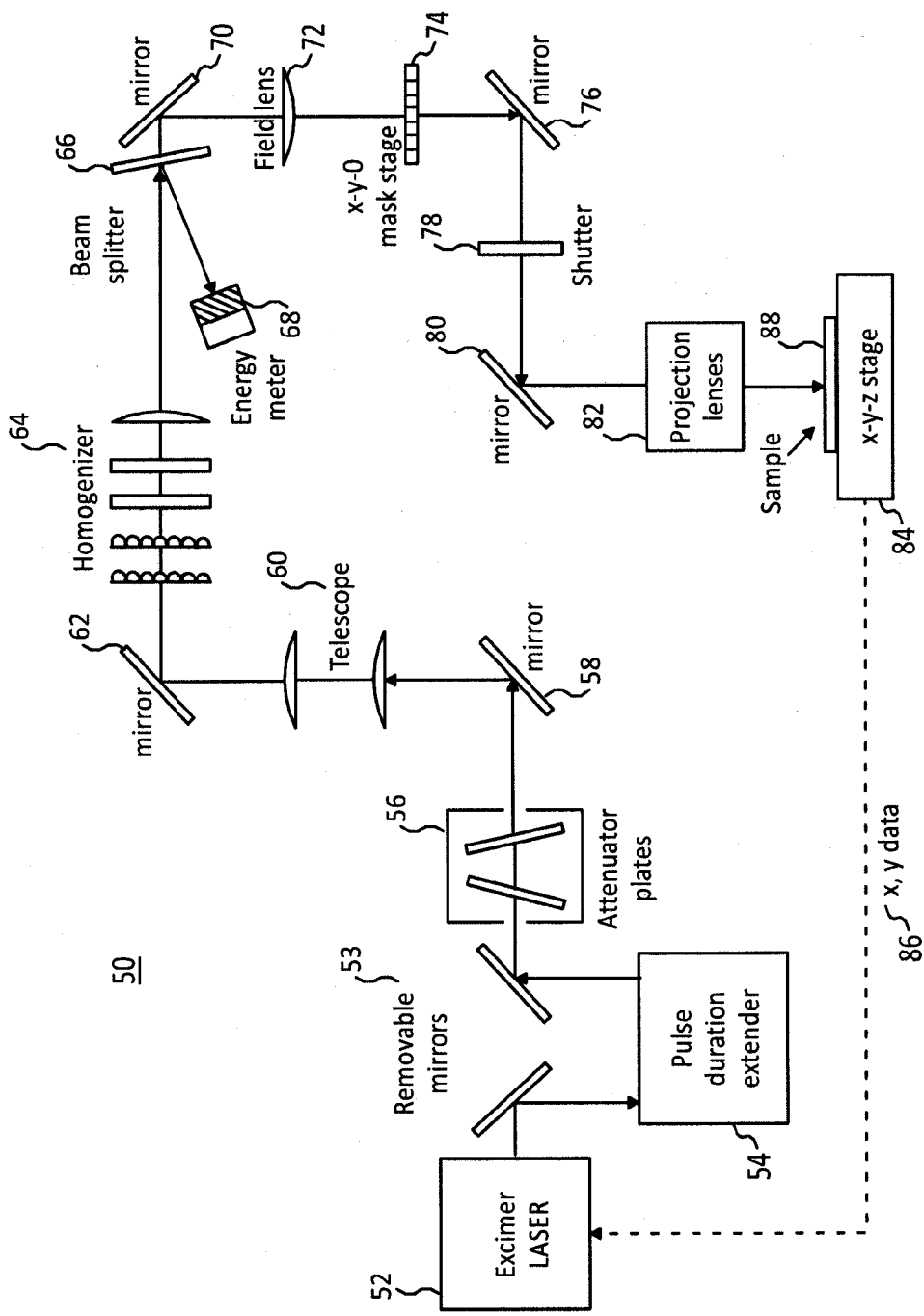
FIG. 5A is a schematic diagram of a dual-axis projection irradiation system used for SLS in accordance with an embodiment of the present invention.

FIG. 5A illustrates an exemplary dual-axis projection SLS system. A light source, for example, an excimer laser 52 generates a laser beam which then passes through a pulse duration extender 54 and attenuator plates 56 prior to passing through optical elements such as mirrors 58, 62, 70, a telescope 60, a homogenizer 64, a beam splitter 66 and a lens 72. The laser beam pulses are then passed through a mask 74 and projection optics 82. The projection optics reduce the size of the laser beam and simultaneously increase the intensity of the optical energy striking the substrate 88 at a desired location. The substrate 88 is provided on a precision x-y-z stage that can accurately position the substrate 88 under the beam and assist in focusing or defocusing the image of the mask 74 produced by the laser beam at the desired location on the substrate.

Figure 5B:
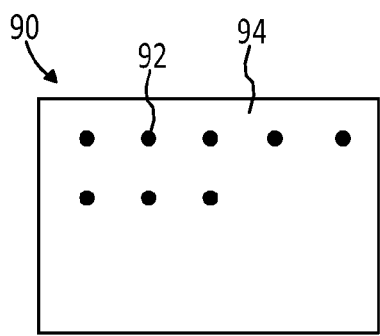
FIG. 5B is an illustrative diagram showing a mask having a polka-dot pattern.
Figure 5C:
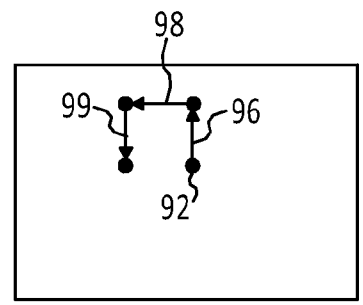
FIG. 5C illustrates the mask translation using the mask of FIG. 5B.

An alternate SLS method is used in different embodiments and is referred to herein as the dot-patterned SLS process. FIG. 5B illustrates a mask 90 incorporating a polka-dot pattern 92. The polka-dot mask 90 is an inverted mask, where the polka-dots 92 correspond to masked regions and the remainder of the mask 94 is transparent. In order to fabricate large silicon crystals, the polka-dot pattern may be sequentially translated about the points on the sample where such crystals are desired. For example, as shown in FIG. 5C, the polka-dot mask may be translated 96 a short distance in the positive Y direction after a first laser pulse, a short distance in the negative X direction 98 after a second laser pulse, and a short distance in the negative Y direction 99 after a third laser pulse to induce the formation of large crystals. If the separation distance between polka-dots is greater than two times the lateral growth distance, a crystalline structure where crystals separated by small grained polycrystalline silicon regions is generated. If the separation distance is less or equal to two times the lateral growth distance so as to avoid nucleation, a crystalline structure where crystals are generated. Further details about this SLS method are described in U.S. Pat. No. 6,555,449, the entire teachings of which are incorporated herein by reference.

Embodiments of the present invention provide uniformly oriented material in epitaxy by performing SLS on a textured precursor. A laterally grown grain adapts the orientation of the seed. The polycrystalline film varies widely from grain to grain in the prior art. By selecting seed crystals of similar crystallographic orientation (texture), it is possible to grow large location-controlled (microstructure) grains of similar crystallographic orientation. The embodiments of this invention are directed at particular combinations of a texture-developing technology and the SLS process.

Conventional methods of obtaining a precursor textured film are used in the first step, including zone melt recrystallization (ZMR), solid phase recrystallization, direct deposition techniques (chemical vapor deposition (CVD), sputtering, evaporation), surface-energy-driven secondary grain growth (SEDSGG) and pulsed laser crystallization (SLS, multiple-pulse ELA) methods. It is envisioned that other texture-inducing methods may also be used in a similar way to generate the textured precursors. Even though the methods of obtaining a precursor textured film are applicable to a large variety of metal and/or semiconductor films, the following methods are described with respect to a silicon film due to the importance of the silicon in semiconductor industry and the level of understanding of silicon in the industry due to all the studies performed to date using silicon.

The following methods are used in different embodiments to provide textured polycrystalline films that can then be used in a hybrid SLS process to create microstructure-controlled and crystallographic-orientation controlled poly-Si films. These methods describe the use of non-patterned planar samples. Methods using patterning, such as graphoepitaxy are often suggested as a means to also reach some control of the microstructure. SLS, however, is not always tolerant of non-planar or patterned films and, in addition, it is most likely superior in controlling the microstructure.

As-Deposited CVD poly-Silicon films can be used to provide (110) or (100) texture in crystalline films. As-deposited poly-silicon films sometimes show texture, depending on the details of the deposition process, such as pressure and temperature. Typically, texture in these films develops throughout the deposition process, that is initial growth at the $SiO_2$ interface is randomly oriented. As the lateral growth in SLS starts at the very edge of the unmolten portion, which is located at the $SiO_2$ interface, crystallographic orientation may still be random (which has been observed for <110> oriented poly-Si films). It is, however, possible that methods are developed that yield texture throughout the thickness of the film or that a post-treatment is performed to establish the same goal through grain growth (i.e., preferred grains growing at the expense of others).

Seed Selection through Ion Channeling (SSIC) can be used to provide (110) texture in crystalline films. Non-textured (or mildly (110)-textured) as-deposited poly-silicon (Si) films can be converted into strongly (110) textured films by silicon "self implantation" at a specific dose close to the complete amorphization threshold followed by solid-phase crystallization. Due to the effect of ion channeling along the <110> directions in Si grains, only those grains that have this direction parallel to the direction of the implantation survive. When the implantation is perpendicular to the surface of the Si film, this means that <110> surface oriented grains survive. During the subsequent recrystallization, a large-grain <110> oriented poly-Si film is obtained.

Surface-Energy-Driven Grain Growth (SEDGG) can be used to generate (111) texture in crystalline film. SEDGG is a particular secondary grain growth mechanism and is commonly also called surface-energy-driven secondary grain growth (SEDSGG). Primary, or normal, grain growth is observed upon heating (>1000° C.) of a material and is driven by a reduction of the grain boundary area. In the case of thin films, this process is halted when the grain diameter reaches values comparable to the film thickness. Beyond that point, secondary, or abnormal, grain growth can occur. This process is driven by free energy anisotropies at the surface and the interface of the secondary grains. Since the magnitude of the surface free energy is almost certainly larger than that of the Si—$SiO_2$ interface free energy, it is expected that minimization thereof dominates the process. The energy of a free surface of Si is minimized with (111) texture and indeed it is observed that secondary grains are predominantly <111>.

Analysis on SEDGG predominantly discusses results obtained with Si films doped with phosphorous (P) or arsenic (As). These dopants are known to enhance the rate of secondary grain growth, through an increase of the grain boundary mobility. Intrinsic films still show secondary grain growth; order to get reasonable growth rates, the driving force and/or increase the grain boundary mobility is increased in alternative ways. Respective examples hereof are decreasing the film thickness or increasing the annealing temperature.

Metal-Induced Lateral Crystallization (MILC) can be used to provide crystalline films having (110) texture. In metal-induced crystallization, metal, the most popular being nickel (Ni), is brought in contact with the Si film and subsequent heating causes the film to crystallize rapidly. When the Ni—Si contacting is done only locally (for example, by having a windowed buffer layer between the Si and metal films), a laterally crystallized poly-Si film is obtained with a lower Ni residue and with a high degree of (110) texture.

In this process, $NiSi_2$ precipitates are formed by Ni diffusion through the Si film. $NiSi_2$ has a cubic lattice and the lattice mismatch with c-Si is only 0.4%. Due to this small mismatch, a few nm of c-Si will grow after which the Ni migrates/diffuses to its surface and the process is repeated. As the process continues, long needle-like crystals are formed and high degree of crystallization can be reached if some additional solid-phase crystallization is allowed to happen sideways from these needle-like crystals. Growth on the $NiSi_2$ precipitates occurs on a single {111} plane only and as such it is one dimensional. Occasionally, however, a different {111} plane is chosen and the needle-like crystal makes a 109° or 71° turn. This process can be sustained when the needles remain in the plane of the film (i.e., they do not hit surface of interface) and this can be achieved when the surface orientation of the grains is <110>.

Partial Melting ZMR can be used to provide crystalline films having (100) texture. Zone-melting recrystallization (ZMR) of Si films results in the formation of large grained polycrystalline Si films having a preferential <100> surface orientation of the crystals. An embodiment of the present invention uses these orientated polycrystalline films as a precursor for crystallization using SLS. The embodiment includes the use of oriented seed grains to promote the formation of large directionally grown oriented crystals. Thus, ZMR of polycrystalline films is used to obtain (100) textured large-grain poly-Si films. Growth of long (100) textured grains starts on grains formed in the "transition region" between the unmelted and the completely melted areas of the film. This is the regime of partial melting (i.e., coexistence of solid and liquid), which only exists in radiatively heated Si films as a result of a significant increase in reflectivity of Si upon melting (a semiconductor-metal transition). In this partial melting regime, <100> grains have been observed to dominate, a phenomenon that is linked to a crystallographic anisotropy in the $SiO_2$—Si interfacial energy.

The above results have typically been obtained at scanning velocities of a few mm/s to less than 1 mm/s. For higher velocities (i.e., for "rapid-ZMR"), (100) textured growth is no longer stable and a random orientation is obtained. It is observed that the crystallographic orientation of laterally growing grains "rolls off" into random orientations. The "transition region", however, exhibits a strong (100) texture, even though the degree decreases with increasing velocity. One way to maximize the degree of texture in partial melting rapid-ZMR is to create a precursor with a maximized number of seeds for <100> growth. One way to do so includes depositing a (100)-textured poly-Si films. It may also work to precrystallize the Si film into very small-grain material that, provided orientation is random, ensures a high density of texture (100) grains, for example, through complete-melting crystallization (CMC) to create nucleated grains.

Figure 9:
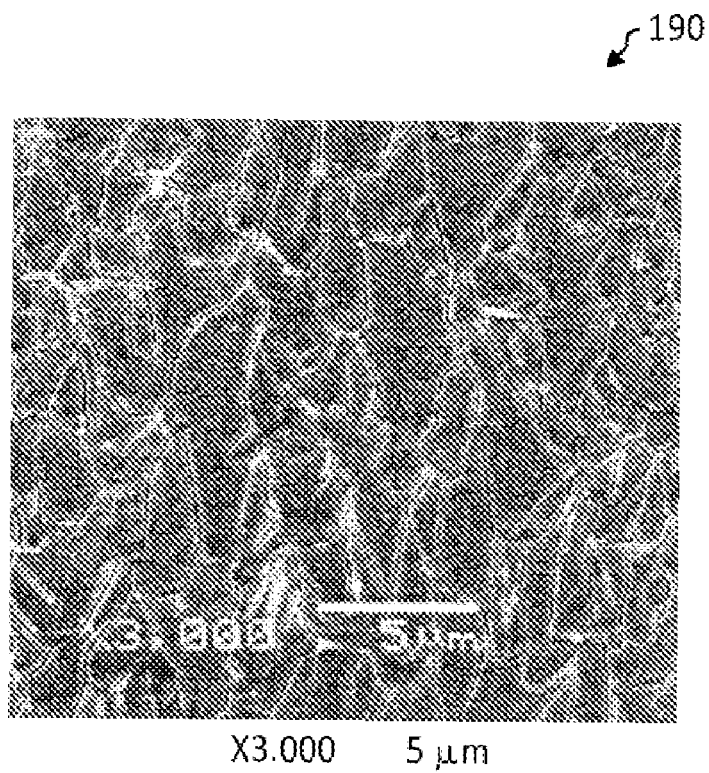
FIG. 9 illustrates an image of a crystallized film of the (100) textured precursor using rapid zone-melting recrystallization (ZMR) using a continuous-wave (CW) laser in accordance with an embodiment of the invention.

Zone melt irradiation using a continuous laser produces silicon films having <100> orientation as described by M. W. Geis et. al., "Zone-Melting recrystallization of Si films with a moveable-strip-heater oven", J. Electro-Chem. Soc. 129, 2812 (1982), the entire teachings of which are incorporated hereby by reference. FIG. 9A illustrates an image of a crystallized film of the (100) textured precursor after partial melting using rapid ZMR using a CW-laser as described herein before. (100) textured are preferred for electronics as it leads to a maximum quality $Si/SiO_2$ interface in terms of the number of interface states.

Near-Complete-Melting ELA can be used to generate crystalline films having (111) texture. Multiple-pulse excimer-laser crystallization in the partial melting regime is used to create uniform poly-Si films having grains that are predominantly <111> surface-oriented. Maximum grain size uniformity can be obtained due to interference effects at the roughened surface of the poly-Si film. This leads to poly-Si films with a grain size that is roughly equal to the wavelength, for example, using a XeCl laser ~300 nm. At slightly higher energy densities, but still below the complete-melting threshold, grain diameter is no longer stabilized by the interference effects and much larger predominantly <111> surface-oriented grains are obtained.

Even though the energy density at which these processes are performed is in the partial melting regime, some complete melting must locally occur in order to allow for the cumulative growth of grains larger than the film thickness. It is suggested that preferential melting can occur at grain boundaries due to a locally enhanced absorption and/or reduced melting temperature. During melting and regrowth of the grain-boundary area, there apparently is a preference for <111> oriented grains either in their resistance to melting or their lateral growing velocity. As a result, <111> oriented grains grow at the expense of differently oriented grains.

Figure 7A:
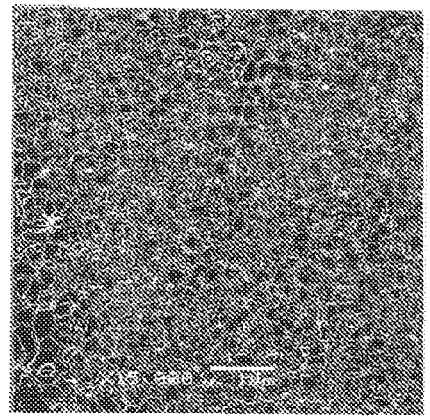
FIGS. 7A-7C illustrate a crystallized film processed with the multiple-pulse grain enlargement of (111) textured precursor with ELA in accordance with an embodiment of the invention.
Figure 7B:
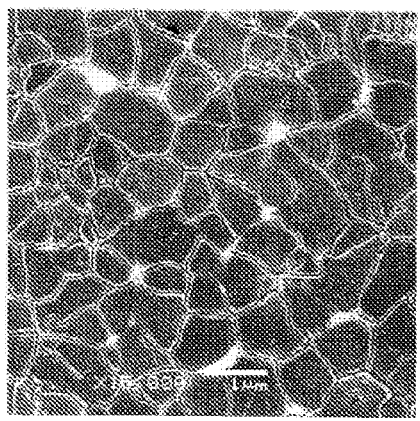
Figure 7C:
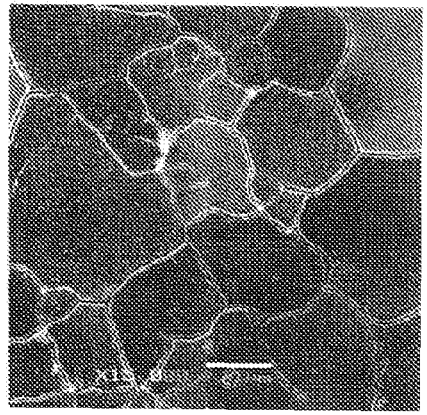

With respect to Si precursor films, multiple-pulse irradiation from an excimer laser in the near-melting regime provides Si films having <111> orientation as described by H. J. Kim and James S. Im in Mat. Res. Soc. Sym. Proc., 321, 665-670 (1994) the entire teachings of which are incorporated herein by reference. FIGS. 7A-7C illustrate a crystallized film processed with the multiple-pulse grain enlargement of (111) textured precursor with ELA.

SLS can be used to generate crystalline films having (110) texture. The hybrid SLS process in certain embodiments can use an SLS process in the first step of generating a textured precursor. The SLS process used in the first step is a texture inducing SLS process. Analysis of directional poly-Si obtained through excimer-laser based SLS (see FIG. 5A) show that depending on the details of the process (film thickness, step size, pulse duration), either (100) or (110) texture is obtained in the direction of the scan. For the surface orientation of the grains, this results in a limitation to a certain range of orientations compatible with these in-plane orientations (for example, (111) surface texture is physically impossible when there is a (100) in-plane texture). The in-plane texture gets developed rather rapidly, as observed from the mild texture for 2-shot SLS. Due to "roll-off" of the orientation, however, it may not get much stronger when grains are extended, even for long-scan directional SLS.

One method to obtain a particular (100) texture includes a particular SLS process to create a certain in-plane texture twice, perpendicular with respect to each other. The details of this process are described in U.S. Patent Application No. 60/503,419, J. S. Im, entitled "Method and system for producing crystalline thin films with a uniform crystalline orientation," the entire teachings of which are incorporated herein by reference. This can lead to formation of surface oriented material: if the orientation is controlled in both x and y directions, the orientation in the z direction per definition is controlled as well.

SLS can be used to generate crystalline films having (111) texture. Analysis of SLS using a pulsed solid-state laser (frequency-doubled Nd:YVO$_4$), are described by M. Nerding et. al., in, "Tailoring texture in laser crystallization of silicon thin-films on glass," Solid State Phenom. 93, 173 (2003), the entire contents of which are incorporated herein by reference. Although fundamentally the same process as with an excimer laser, there are some differences that can influence the orientation of the grains. The most prominent of these is the wavelength (532 nm), but it is possible that the spatial profile (Gaussian) and the pulse duration (20 ns) also play a role in the process. When SiN$_x$ buffer layers are used, however, a strong (111) surface orientation is obtained for a film thickness of at least approximately 150 nm.

In an embodiment, epitaxial growth of III-V semiconductors, such as Gallium arsenide (GaAs), on a Silicon (Si) carrier enables products that combine the benefits of both materials: for example, light emitting diodes (LEDs) made in GaAs combined with electrical circuitry made in Si. If, in addition, the Si is a deposited film on top of a non-semiconducting substrate, such as glass, one is able to have these benefits on large-area and/or transparent substrates for a low price.

Proper epitaxy, however, requires both high-quality (i.e., defect free) as well as a uniformly oriented material. High quality can be achieved with the sequential lateral solidification (SLS) method, most importantly, with processes that can be used to create location-controlled single-crystal islands. In particular, the embodiments described herein of the hybrid SLS process are useful in the thin film transistor (TFT) industry as they leverage epitaxial growth, provide for TFT uniformity though anisotropy of performance level both through mobility and through interfacial defect density and TFT uniformity through quality of the material. Details of the effects of uniformity of TFTs, being field effect devices, are described by T. Sato, Y. Takeishi, H. Hara and Y. Okamoto, "Mobility anisotropy of electrons in inversion layers on oxidized silicon surfaces," in Physical Review B (Solid State) 4, 1950 (1971) and by M. H. White and J. R. Cricchi, "Characterization of thin-oxide MNOS memory transistors," in IEEE Trans. Electron Devices ED-19, 1280 (1972), the entire teachings of both are incorporated herein by reference.

In an embodiment, a higher energy-density ELA process as described herein before is used as a result of which a larger average grain size film is obtained. These films can either have a strong (111) or (100) texture depending upon the conditions of the ELA process selected; a process that is likely to be related to anisotropies in melting and solidification of differently oriented grains. A very high degree of texture is obtained with commercially available line-beam ELA systems. These precursor textured films are not used in production of TFTs or for epitaxial processes due to the randomness of the microstructure.

Figure 6A:
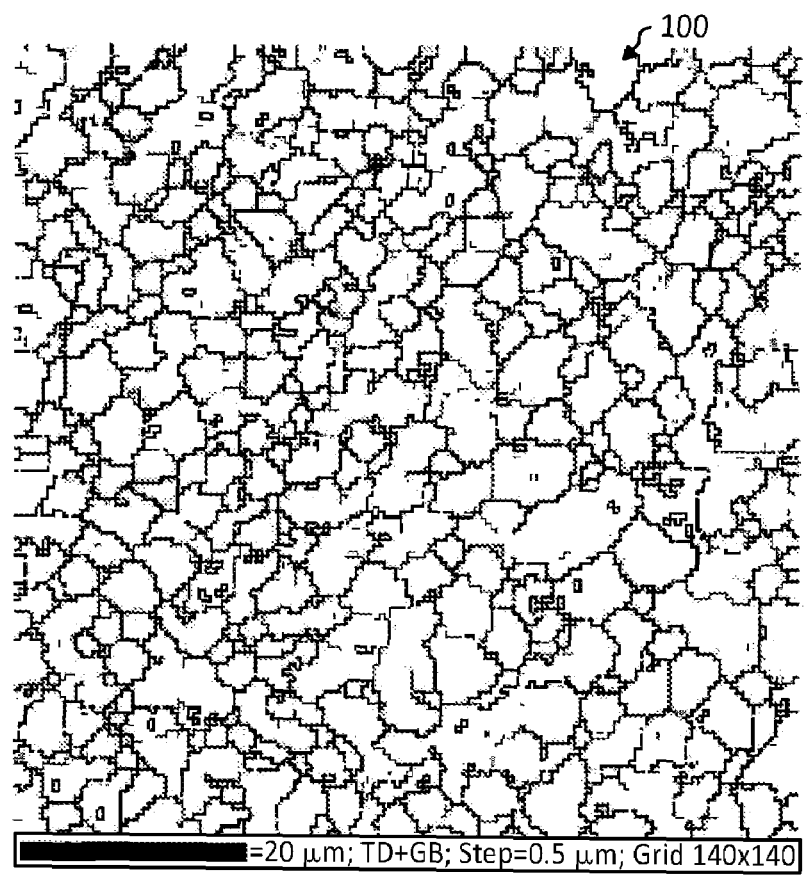
FIGS. 6A and 6B illustrate images of a crystallized film using electron back scatter diffraction for mapping crystallographic orientation resulting from the hybrid SLS process for <111> islands after creation of the textured precursor and after the SLS process, respectively, and respective inverse pole figures, FIGS. 6A-1, and 6B-1, in accordance with an embodiment of the present invention.
Figures 1, 6A:
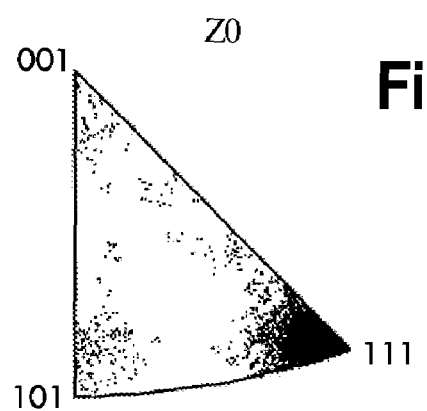
Figure 6B:
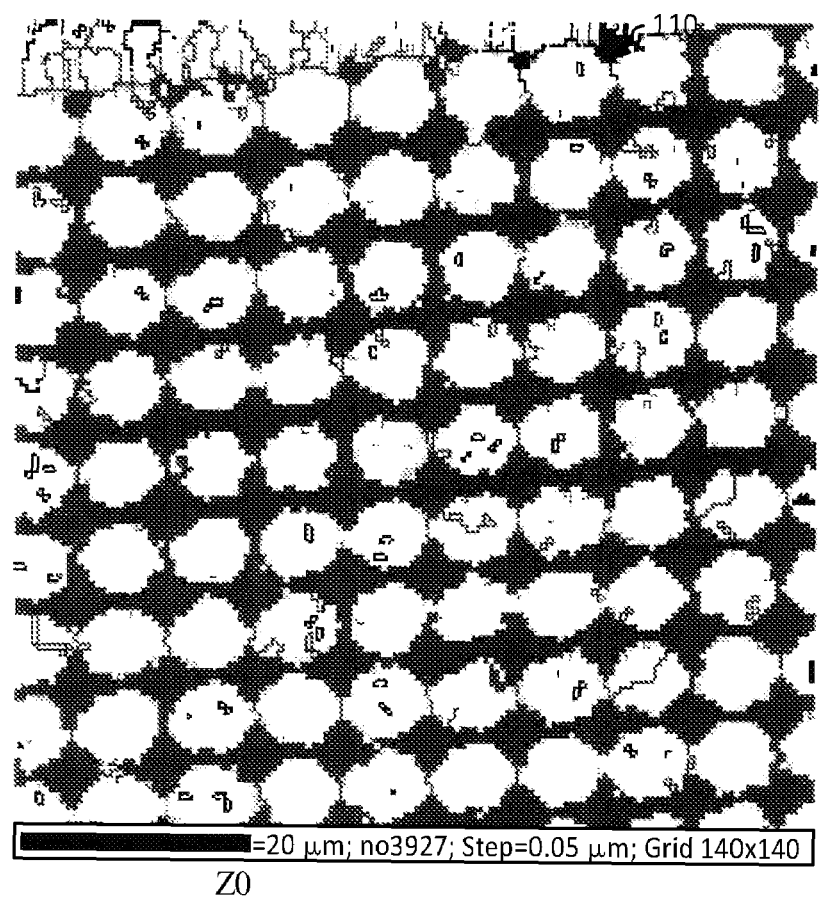
Figures 1, 6B:
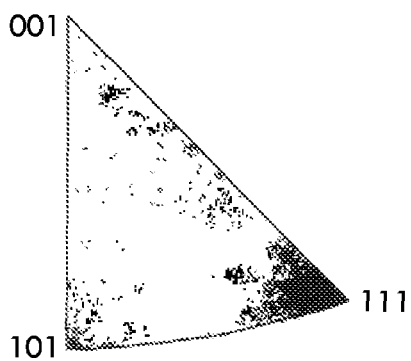

FIGS. 6A and 6B illustrate images of a crystallized film resulting from the hybrid SLS process for <111> islands after creation of the textured precursor (FIG. 6A) using the aforementioned high-energy ELA process followed by the SLS process (FIG. 6B) respectively, in accordance with an embodiment of the invention. Data for the FIGS. 6A and 6B was collected using electron back scatter diffraction (EBSD), a scanning electron-microscopy (SEM) based method for mapping of the crystallographic orientation. FIG. 6A shows a map and its corresponding inverse pole figure (IPF) (FIG. 6A-1) of a film after step one of the process, using multiple-pulse ELA at an energy density slightly higher than that commonly used in manufacturing of TFT (i.e., as shown in FIG. 6B). The map 100 illustrates random high-angle grain boundaries, while the IPF shows the strong texture in these (111) grains. FIG. 6B and its corresponding IPF (FIG. 6B-1) illustrates the image of the film after performance of the SLS process having a dot-patterned mask (referred to herein also as dot-SLS) as described in U.S. patent application Ser. No. 10/944,350, the entire teachings of which are incorporated herein by reference. The microstructure is well controlled (i.e., location-controlled single-crystal regions) and the texture is maintained.

The experimental conditions for the embodiment [(111) texture, SLS (150 nm Si)] include scanning a 500×500 μm$^2$ with a 4 μm between-pulse translation leading to 125 pulses per unit area, performed with the SLS system described with respect to FIG. 5A. A commercially available ELA system can be used in an alternate embodiment and fewer pulses per unit area may be sufficient to reach the desired degree of texture. For the second step of SLS processing, a 4-shot dot—SLS system using ~1.8 μm large shadow regions placed in an 8 μm square grid is used.

Combining the ELA pretreatment with the SLS process as described in U.S. patent application Ser. No. 10/944,350, the entire contents of which are incorporated herein by reference, leads to location-controlled single-crystal islands with a <111> orientation that may be useful for epitaxial growth of III-V semiconductors or even for uniform TFT on low-cost large-area transparent substrates.

Figure 8A:
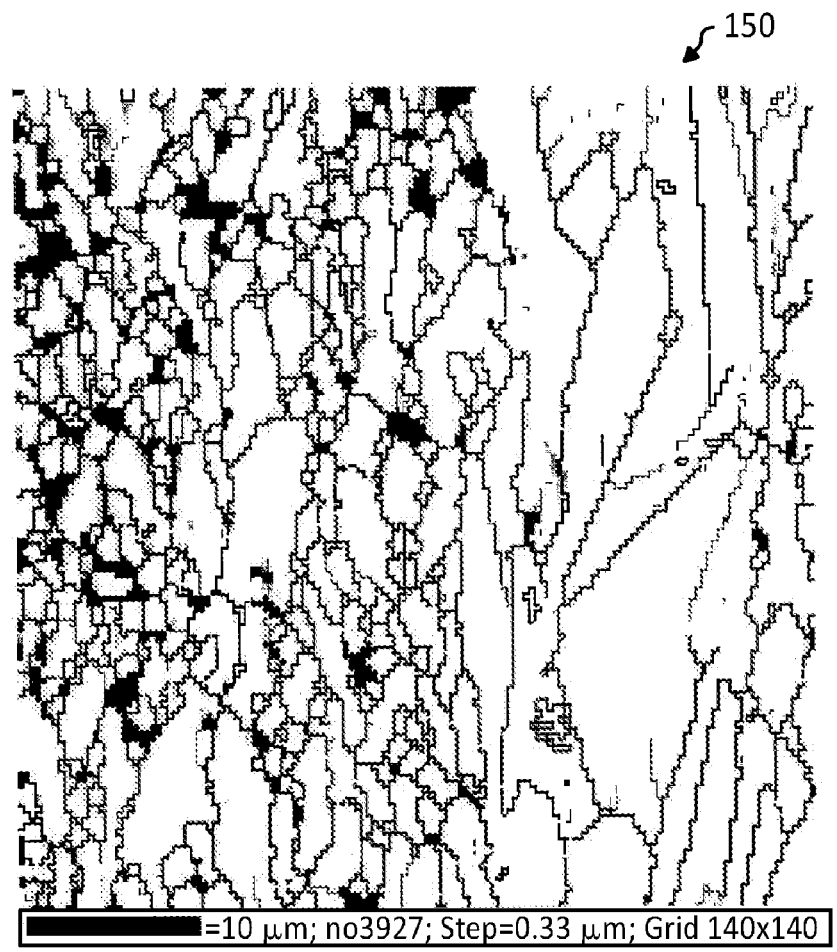
FIGS. 8A and 8B illustrate images of a crystallized film using electron back scatter diffraction for mapping crystallographic orientation resulting from the hybrid SLS process for <100> islands after the creation of the textured precursor and after the SLS process, respectively, and respective inverse pole figures, FIGS. 8A-1, and 8B-1 in accordance with an embodiment of the invention.
Figures 1, 8A:
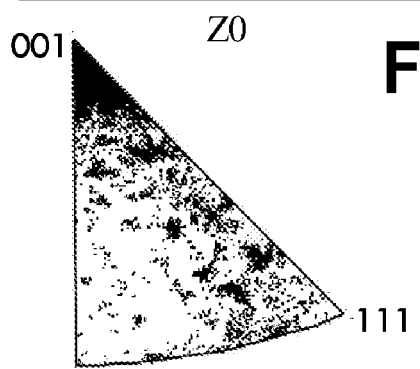
Figure 8B:
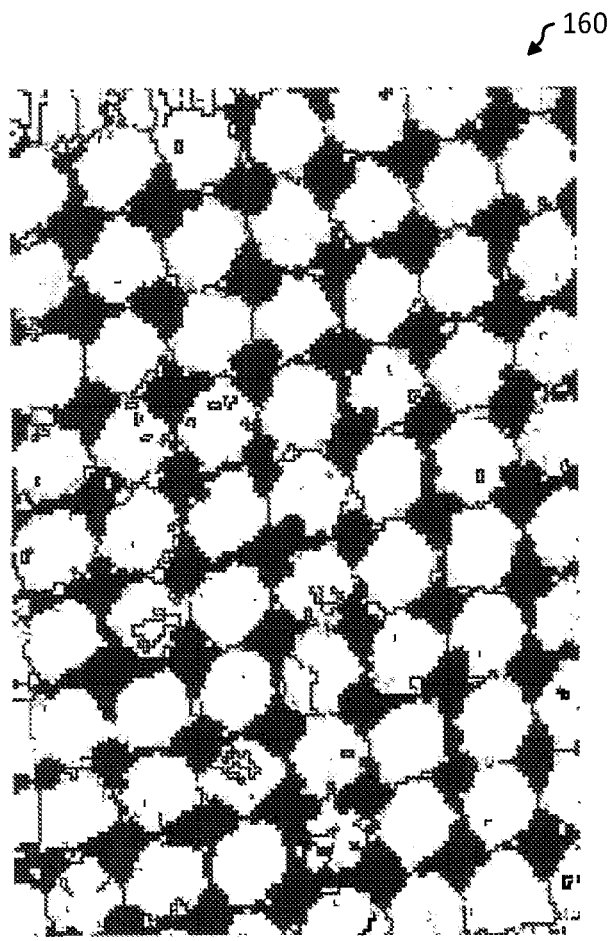
Figures 1, 8B:
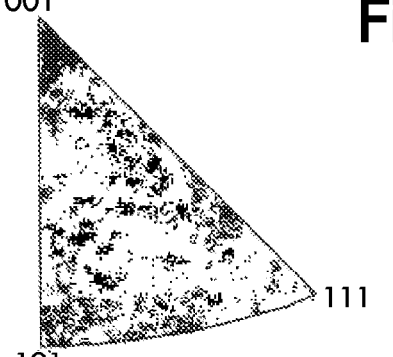

FIGS. 8A and 8B illustrate an image of a crystallized film for mapping of the crystallographic orientation resulting from the hybrid SLS process for <100> islands after creation of the textured precursor (FIG. 8A) using the aforementioned ELA process, and after the SLS process (FIG. 8B), respectively, in accordance with an embodiment of the invention. Data for the images in FIGS. 8A and 8B are collected using the electron back scatter diffraction method for mapping of the crystallographic orientation. FIG. 8A shows a map and its corresponding inverse pole figure (IPF) (FIG. 8A-1) of a film after step one of the process carried out using the multiple-pulse ELA at an energy density slightly higher than that commonly used in manufacturing of TFTs. FIG. 8B and its corresponding IPF (FIG. 8B-1) shows the image after performance of the dot-SLS process. The experimental conditions for this embodiment include the use of a frequency-doubled (532 nm) Nd:YV04 continuous wave laser shaped in a thin beam (100s μm long, ~10 or tens of μm wide) scanned at 1 cm/s. FIG. 8B uses a 3.3 cm/s scan followed by 4-shot dot-SLS process using the system described in FIG. 5A.

Figure 10A:
FIGS. 10A-10C illustrate transmission electron microscopy (TEM) images of mostly <110>, <111> and <100> oriented islands, respectively.
Figure 10B:
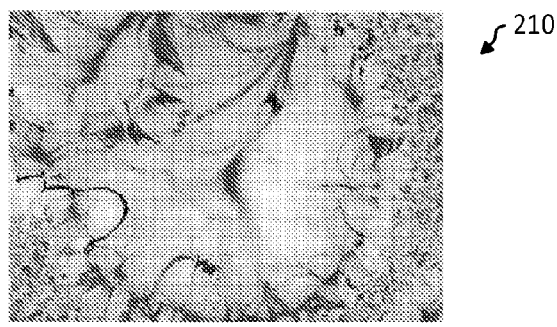
Figure 10C:
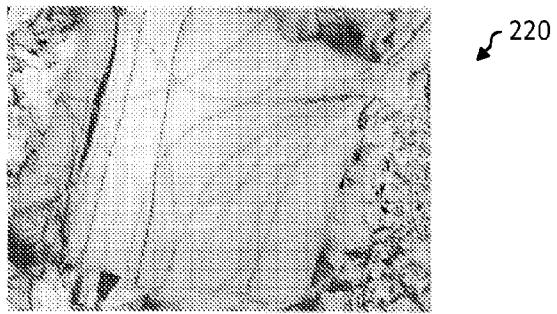
Figure 11C:
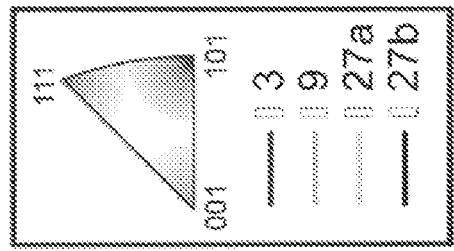
FIGS. 11A-11C illustrate the scanning electron microscopy images (SEM) and the electron back scatter diffraction (EBSD) data of the mostly <110> oriented islands corresponding to the image illustrated in FIG. 10A.
Figure 11C:
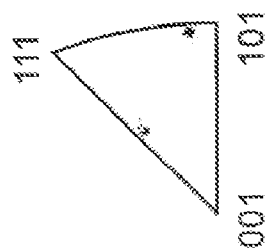
Figure 11C:
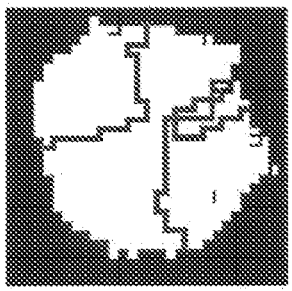
Figure 11B:
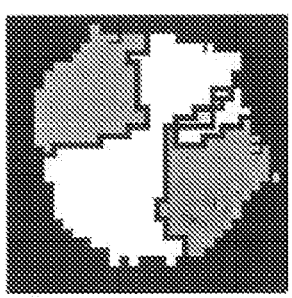
Figure 11A:
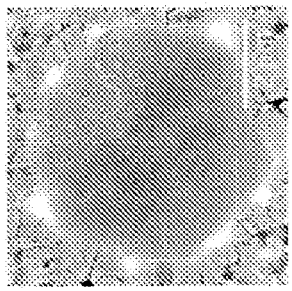
Figures 12A, 12B, 12C:
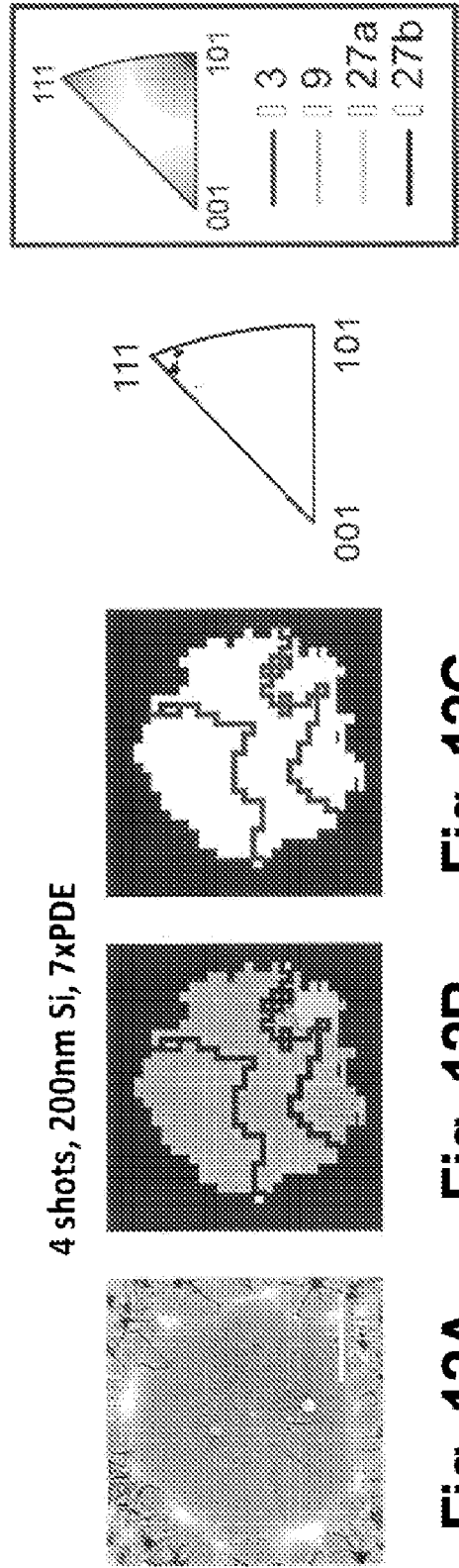
FIGS. 12A-12C illustrate the scanning electron microscopy images (SEM) and the electron back scatter diffraction (EBSD) data of the mostly <111> oriented islands corresponding to the image illustrated in FIG. 10B.

FIGS. 10A-10C illustrate transmission electron microscopy (TEM) images of mostly <110>, <111> and <100> oriented islands, respectively. FIGS. 11A-11C illustrate the scanning electron microscopy images (SEM) and the electron back scatter diffraction (EBSD) data of the mostly <110> oriented islands corresponding to the image illustrated in FIG. 10A. FIGS. 12A-12C illustrate the scanning electron microscopy images (SEM) and the electron back scatter diffraction (EBSD) data of the mostly <111> oriented islands corresponding to the image illustrated in FIG. 10B. FIGS. 13A-13C illustrate the scanning electron microscopy images (SEM) and the electron back scatter diffraction (EBSD) data of the mostly <100> oriented islands corresponding to the image illustrated in FIG. 10C.

In FIGS. 10A-10C, it is observed that the predominant planar defect is the Sigma3 boundary. Sigma3 boundaries are one of a series of special high-angle grain boundaries described by the coincident-site lattice (CSL) as opposed to random high-angle grain boundaries which are shown in the EBSD results herein before with respect to FIGS. 6A, 6B, 8A and 8B. In its most particular form, these boundaries are twin boundaries, meaning they may have no electrical activity. In general, CSL boundaries tend to have a lower defect density and are thus less harmful for electrical properties. It has been observed that these boundaries are formed during crystallization rather than being present in the precursor. FIG. 10A illustrates that the surface orientation changes upon formation of Sigma3 planar defects and the island contains many defects. In FIG. 10B, the <111> surface orientation has fewer defects, and no change in surface orientation (important for applications where the surface orientation is crucial, such as epitaxy and TFTs). In FIG. 10C, the <100> surface orientation is predominantly free of planar defects.

In particular embodiments using the dot-SLS (process dot-patterned mask) the <111> and <100> islands can be obtained island having the <100> orientation have the lowest density of defects, followed by <111>. These two observations indicate a preference for especially <100> and to a lesser degree <111> orientation. These observations are valid when working at typical conditions (i.e., 50-250 nm Si films, 30-300 ns pulse duration, room temperature, etc.). Alternate embodiments that include working at different conditions, can suppress the formation of Sigma3 boundaries, meaning that defect free islands of any orientation can be obtained.

In view of the wide variety of embodiments to which the principles of the present invention can be applied, it should be understood that the illustrated embodiments are exemplary only, and should not be taken as limiting the scope of the present invention. For example, the steps of the diagrams may be taken in sequences other than those described, and more or fewer elements may be used in the diagrams. While various elements of the embodiments have been described as being implemented in software, other embodiments in hardware or firmware implementations may alternatively be used, and vice-versa.

It will be apparent to those of ordinary skill in the art that methods involved in creating crystallographic orientation controlled poly-silicon films may be embodied in a computer program product that includes a computer usable medium. For example, such a computer usable medium can include a readable memory device, such as, a hard drive device, a CD-ROM, a DVD-ROM, or a computer diskette, having computer readable program code segments stored thereon. The computer readable medium can also include a communications or transmission medium, such as, a bus or a communications link, either optical, wired, or wireless having program code segments carried thereon as digital or analog data signals.

Other aspects, modifications, and embodiments are within the scope of the following claims.

What is claimed is:

1. A method of processing a semiconductor film on a substrate, the method comprising:
   providing a textured semiconductor film comprising crystal grains having a crystallographic orientation predominantly in one direction present below the surface of the semiconductor film and near the interface between the substrate and the semiconductor film; and
   generating a microstructure using laser-induced lateral crystallization for providing location-controlled growth of said crystal grains orientated in said crystallographic orientation, wherein the crystallization is initiated within the bulk of the textured semiconductor film near the interface between the substrate and the semiconductor film.

2. The method of claim 1, wherein the microstructure is generated using sequential lateral solidification crystallization comprising:
   generating a plurality of laser beam pulses;
   directing the plurality of laser beam pulses through a mask to generate a plurality of patterned laser beams;
   irradiating a portion of the film with one of the plurality of patterned beams, said beam having an intensity that is sufficient to melt through the entire thickness of the irradiated portion of the film, wherein the irradiated portion of the film laterally crystallizes upon cooling; and
   repositioning the film to irradiate a subsequent portion with patterned beams, such that the subsequent portion of the film overlaps with the previously irradiated portion permitting further lateral growth of the crystal grains.

3. The method of claim 1, wherein the microstructure is generated using sequential lateral solidification crystallization comprising:
   generating a plurality of laser beam pulses;
   directing the plurality of laser beam pulses through a mask to generate a plurality of patterned laser beams;
   irradiating a portion of a selected region of the film with one of the plurality of patterned beams, said beam having an intensity that is sufficient to melt the irradiated portion of the film, wherein the irradiated portion of the film crystallizes upon cooling; and moving the film along a first translation pathway and moving the mask along a second translation pathway while successive portions of the selected region are irradiated with patterned beams, such that the selected region of the film is substantially completely crystallized in a single traversal of the patterned beams over the selected region of the film.

4. The method of claim 2, wherein the mask comprises a dot-patterned mask.

5. The method according to claim 2, wherein the mask includes array patterns which include at least one of dot-shaped areas, hexagonal-shaped areas and rectangular-shaped areas.

6. The method of claim 1, wherein the textured film is generated by one of zone melt recrystallization, solid phase recrystallization, direct deposition methods, surface-energy driven secondary grain growth methods and pulsed laser crystallization methods.

7. The method of claim 6, wherein the direct deposition methods comprise one of chemical vapor deposition, sputtering and evaporation.

8. The method of claim 6, wherein the pulsed laser crystallization methods comprise one of sequential lateral solidification and multiple-pulse ELA processes.

9. The method of claim 1, wherein the film is a semiconductor film.

10. The method of claim 1, wherein the film is a metallic film.

11. The method of claim 1, wherein the one direction is a direction normal to the plane of the film.

12. The method according to claim 11, wherein the film is a silicon film and the predominant crystallographic orientation is a <111> orientation.

13. The method according to claim 11, wherein the film is a silicon film and the predominant crystallographic orientation is a <100> orientation.

14. The method of claim 5, wherein the mask comprises an array of opaque dot-shaped areas.

15. The method of claim 1, wherein the microstructure is generated using sequential lateral solidification crystallization comprising:

generating a plurality of laser beam pulses;

irradiating a portion of the film with one of the plurality of laser beam pulses, said laser beam pulses having an intensity that is sufficient to melt through the entire thickness of the irradiated portion of the film, wherein the irradiated portion of the film laterally crystallizes upon cooling; and repositioning the film to irradiate a subsequent portion with patterned beams, such that the subsequent portion of the film overlaps with the previously irradiated portion permitting further lateral growth of the crystal grains.

16. The method of claim 1, wherein said crystallographic orientation is selected such that during location-controlled growth said predominant crystallographic orientation of said crystal grain is maintained.

17. The method of claim 1, wherein said crystallographic orientation is selected such that during location-controlled growth no defects are formed in the microstructure or only defects are formed that do not alter said crystallographic orientation.

18. The method of claim 1, wherein the film is a silicon film, and the one direction is a direction normal to the plane of the film, and further wherein the predominant crystallographic orientation is a <100> orientation or a <111> orientation.

19. The method of claim 1, wherein laser-induced lateral crystallization is performed for a short distance such that no defects are formed in the microstructure or only defects are formed that do not alter said crystallographic orientation.

* * * * *

UNITED STATES PATENT AND TRADEMARK OFFICE
CERTIFICATE OF CORRECTION

PATENT NO. : 7,645,337 B2 Page 1 of 1
APPLICATION NO. : 10/994205
DATED : January 12, 2010
INVENTOR(S) : Im et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 346 days.

Signed and Sealed this

Sixteenth Day of November, 2010

David J. Kappos
*Director of the United States Patent and Trademark Office*